United States Patent
Appelt et al.

(10) Patent No.: US 10,186,467 B2
(45) Date of Patent: Jan. 22, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Bernd Karl Appelt, Kaohsiung (TW); Kay Stefan Essig, Kaohsiung (TW); Chi-Tsung Chiu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/649,545

(22) Filed: Jul. 13, 2017

(65) Prior Publication Data

US 2018/0019221 A1    Jan. 18, 2018

Related U.S. Application Data

(60) Provisional application No. 62/363,130, filed on Jul. 15, 2016.

(51) Int. Cl.
*H01L 23/538* (2006.01)
*H01L 23/31* (2006.01)
(Continued)

(52) U.S. Cl.
CPC ........ *H01L 23/3135* (2013.01); *H01L 21/486* (2013.01); *H01L 21/561* (2013.01); *H01L 21/563* (2013.01); *H01L 21/568* (2013.01); *H01L 21/76805* (2013.01); *H01L 21/76879* (2013.01); *H01L 23/3128* (2013.01); *H01L 23/3142* (2013.01); *H01L 23/3157* (2013.01); *H01L 23/367* (2013.01); *H01L 23/481* (2013.01); *H01L 23/49827* (2013.01); *H01L 23/5384* (2013.01); *H01L 23/5389* (2013.01); *H01L 24/19* (2013.01); *H01L 24/20* (2013.01); *H01L 24/27* (2013.01); *H01L 24/32* (2013.01); *H01L 25/0655* (2013.01); *H01L 25/0657* (2013.01); *H01L 23/145* (2013.01); *H01L 23/3677* (2013.01); *H01L 2224/211* (2013.01); *H01L 2224/215* (2013.01); *H01L 2224/32146* (2013.01); *H01L 2225/06524* (2013.01); *H01L 2225/06548* (2013.01);
(Continued)

(58) Field of Classification Search
CPC ............. H01L 23/3142; H01L 23/3157; H01L 2224/8385; H01L 2224/83889
USPC ........................................ 257/666, 774, 775
See application file for complete search history.

(56) References Cited

U.S. PATENT DOCUMENTS 7,759,777 B2   7/2010 Otremba et al.
8,030,131 B2  10/2011 Otremba et al.
(Continued)

*Primary Examiner* — David Vu
*Assistant Examiner* — Brandon Fox
(74) *Attorney, Agent, or Firm* — Foley & Lardner LLP; Cliff Z. Liu

(57) ABSTRACT

A semiconductor package device includes a first die, an adhesive layer, and an encapsulant layer. The first die comprises a first electrode at a first surface of the first die and a second electrode at a second surface of the first die opposite to the first surface of the first die. The adhesive layer is disposed on the first surface of the first die. The encapsulant layer encapsulates the first die and the adhesive layer, wherein substantially an entire surface of the second electrode is exposed from the encapsulant layer.

20 Claims, 20 Drawing Sheets

(51) Int. Cl.
   *H01L 21/768* (2006.01)
   *H01L 21/48* (2006.01)
   *H01L 21/56* (2006.01)
   *H01L 23/498* (2006.01)
   *H01L 23/00* (2006.01)
   *H01L 25/065* (2006.01)
   *H01L 23/367* (2006.01)
   *H01L 23/48* (2006.01)
   *H01L 23/14* (2006.01)

(52) U.S. Cl.
   CPC ............. *H01L 2225/06582* (2013.01); *H01L 2924/01022* (2013.01); *H01L 2924/01029* (2013.01)

(56) References Cited

U.S. PATENT DOCUMENTS

| | | | |
|---|---|---|---|
| 8,120,158 B2 | 2/2012 | Ewe et al. | |
| 8,294,276 B1* | 10/2012 | Kim | H01L 21/561 257/773 |
| 8,871,630 B2 | 10/2014 | Otremba et al. | |
| 2011/0140254 A1* | 6/2011 | Tsai | H01L 23/495 257/676 |
| 2013/0207255 A1* | 8/2013 | Magnus | H01L 24/96 257/712 |

* cited by examiner

SEMICONDUCTOR PACKAGE DEVICE AND METHOD OF MANUFACTURING THE SAME

CROSS-REFERENCE TO RELATED APPLICATIONS

This application claims the benefit of and priority to U.S. Provisional Application No. 62/363,130, filed Jul. 15, 2016, the content of which is incorporated herein by reference in its entirety.

BACKGROUND

1. Technical Field

The present disclosure generally relates to a semiconductor package device and a method of manufacturing the same.

2. Description of the Related Art

A semiconductor device (e.g. a die or a chip) can be attached to a carrier and encapsulated by an encapsulant to form a semiconductor device package. To promote miniaturization, a cavity can be formed in the carrier to accommodate the semiconductor device. A protective film can be laminated to the semiconductor device and the carrier. A redistribution structure, which can be formed over the semiconductor device by, for example, a photolithography technique, a plating technique, or other appropriate technique, can be used for external connection. However, this process of manufacturing the semiconductor device package can be expensive. Moreover, such a process can involve highly accurate alignment and registration techniques.

SUMMARY

In one or more embodiments, according to one aspect of the present disclosure, a semiconductor package device is provided. The semiconductor package device includes a first die, an adhesive layer, and an encapsulant layer. The first die comprises a first electrode disposed at a first surface of the first die and a second electrode disposed at a second surface of the first die opposite to the first surface of the first die. The adhesive layer is disposed on the first surface of the first die. The encapsulant layer encapsulates the first die and the adhesive layer, wherein substantially an entire surface of the second electrode is exposed from the encapsulant layer.

In one or more embodiments, according to another aspect of the present disclosure, a method of manufacturing a semiconductor package device includes providing a carrier having a first conductive layer disposed thereon, and attaching a first side of a first die to the carrier through a first adhesive layer, the first die including a first electrode disposed at the first side and a second electrode disposed at a second side opposite to the first side. The method further includes encapsulating the first die and the first adhesive layer with an encapsulant such that substantially an entire surface of the second electrode of the first die is exposed from the encapsulant, and removing the carrier.

BRIEF DESCRIPTION OF THE DRAWINGS

Aspects of the present disclosure are best understood from the following detailed description when read with the accompanying Figures. Various features may not be drawn to scale, and the dimensions of the depicted features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
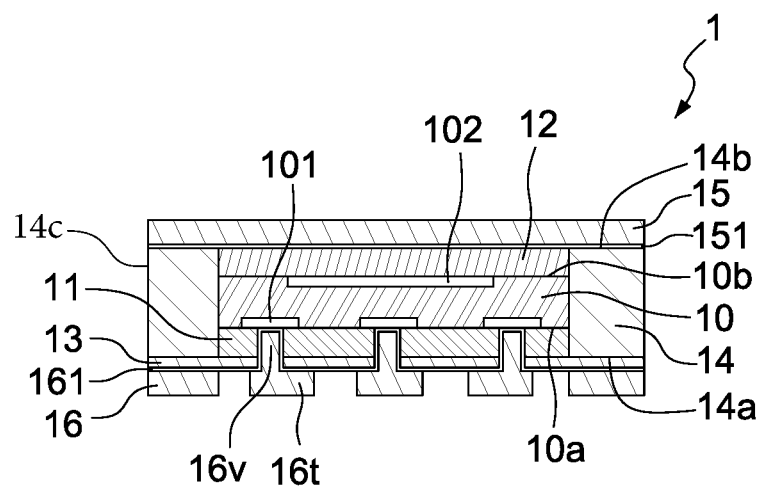
FIG. 1A and FIG. 1B illustrate a cross-sectional view of some embodiments of a semiconductor package device in accordance with a first aspect of the present disclosure.

FIG. 1A illustrates a cross-sectional view of some embodiments of a semiconductor package device 1 in accordance with a first aspect of the present disclosure. The semiconductor package device 1 includes a die 10, an adhesive layer 11, a conductive layer 12, a patterned conductive layer 13, an encapsulant layer 14, a conductive layer 15, and a patterned conductive layer 16.

The die 10 has a surface 10a and another surface 10b opposite to the surface 10a. In some embodiments, the surface 10a may be referred to as a front side, and the surface 10b may be referred to as a back side, however, this description is merely for convenience and is not intended to limit any aspects of the surfaces 10a, 10b. The die 10 may include semiconductor materials, such as silicon (Si) and group III-V materials (e.g. materials including elements of the periodic table groups III and V), and may be doped with other suitable materials. The die 10 may include a semiconductor substrate, one or more integrated circuit devices and one or more overlying interconnection structures, the integrated circuit devices may include active devices such as transistors and/or passive devices such resistors, capacitors, inductors, or a combination thereof. In some embodiments, the die 10 may be a power device, such as a power transistor, a power diode or an IGBT (Insulated Gate Bipolar Transistor). The power device may consume more electric current or power and thus dissipate more thermal energy than non-power devices (such as logic components and/or controllers).

The die 10 may include an electrode 101 on or at the surface 10a and an electrode 102 on or at the surface 10b. The electrodes 101, 102 may provide for external electrical communication with the die 10. In some embodiments, the electrodes 101, 102 may include contacts or pads. In some embodiments, more than one electrode 101 may be disposed on the surface 10a. In some embodiments, more than one electrode 102 may be disposed on the surface 10b. A size of the electrode 101 may differ from that of the electrode 102. The size of the electrode 101 may have a size substantially equal to that of the electrode 102.

The adhesive layer 11 is disposed on the surface 10a of the die 10 and may serve to attach the die 10 to other parts of the semiconductor package device 1 (e.g., to the patterned conductive layer 13). In some embodiments, the adhesive layer 11 may be an adhesive layer such as a gel-type or film-type adhesive layer. The adhesive layer 11 may include a thermoset resin. The adhesive layer 11 may include a thermoplastic resin. The adhesive layer 11 may include one or more of the following: a resin, a polyester resin, a polyether resin, an epoxy resin and a polyolefin composition. The adhesive layer 11 may be thicker than the die 10. The adhesive layer 11 may be thinner than or substantially as thick as the die 10. The adhesive layer 11 may be disposed along a perimeter of the die 10. The adhesive layer 11 may define one or more openings or recesses, which may expose the electrode 101.

The conductive layer 12 is disposed on the surface 10b of the die 10. The conductive layer 12 is optional. The conductive layer 12 may be omitted in accordance with some embodiments of the present disclosure. The electrode 102 may be in contact with the conductive layer 12 (e.g. a portion of the electrode 102 may be in contact with the conductive layer 12, or substantially an entire surface (e.g. a top surface) of the electrode 102 may be in contact with the conductive layer 12). In some embodiments, the conductive layer 12 may include a backside metal layer. In some embodiments, the conductive layer 12 may be used to provide for improved thermal and/or electrical transmission characteristics, compared to, for example, some implementations of solder bonding or transient phase liquid bonding (TLP), each of which can result in higher electrical and thermal resistance. In some embodiments, the conductive layer 12 may operate as a heat slug or heat sink or heat spreader. Additionally, certain methods of providing the conductive layer 12, such as plating, provide for reduced thermal stresses during manufacture because, for example, a plating technique can be performed at moderate temperature (e.g., less than about 50 degrees Celsius (° C.), such as less than about 45° C., less than about 40° C., or less than about 35° C.) as opposed to soldering (which can be performed at, for example, temperatures greater than about 170° C., such as greater than about 180° C., greater than about 190° C., or greater than about 200° C.) or TLP (which can be performed, for example, at temperatures up to about 450° C. or higher). Further, solder or TLP reflow can cause the die 10 to shift and thereby increase misalignment. The improved electrical transmission characteristics, such a lower electrical resistance of the conductive layer 12, can be beneficial, for example, when the conductive layer 12 is connected in a power or ground path, or in a high current path.

The encapsulant layer 14 has a surface 14a, a surface 14b and a lateral surface 14c extending between the surfaces 14a, 14b. In some embodiments, the encapsulant layer 14 may include, but is not limited to, an epoxy resin having fillers, a molding compound (e.g., an epoxy molding compound or other molding compound), a polyimide, a phenolic compound or material, a material with a silicone dispersed therein, or a combination thereof.

The encapsulant layer 14 may encapsulate the die 10, the adhesive layer 11, and the optional conductive layer 12. The electrode 102 (e.g. a top surface of the electrode 102) may be exposed, in whole or in part, from the encapsulant layer 14. For example, substantially an entire surface (e.g. a top surface) of the electrode 102 may be exposed from the encapsulant layer 14 such that at least 90% of the top surface of the electrode 102 is exposed from the encapsulant layer 14 (e.g., at least about 92%, at least about 95%, at least about 98%, or more of the top surface of the electrode 102 is exposed). Such exposure can provide for the electrode 102 being in electrical and/or thermal communication with parts or components of the semiconductor package device 1 other than the encapsulant layer 14 that may have more desirable electrical and/or thermal characteristics than does the encapsulant layer 14 (such as, in some implementations, lower electrical and/or thermal resistances). In some embodiments, the more the electrode 102 is exposed to the other parts or components of the semiconductor package device 1 having lower electrical and/or thermal resistances, the stronger is the electrical and thermal communication therebetween.

The surface 14a may be substantially coplanar with the surface 10a, or may be substantially coplanar with a bottom surface of the adhesive layer 11. In some embodiments, the surface 14b may be substantially coplanar with the surface 10b of the die 10 or with a surface of the conductive layer 12 (e.g. in implementations that include the conductive layer 12). In some embodiments, one or more surfaces of the adhesive layer 11 may be recessed from the surface 14a. In some embodiments, the surface 10b and/or a top surface of the conductive layer 12 may be recessed from the surface 14b.

The conductive layer 15 is disposed over the encapsulant layer 14 and the die 10, and may be sputtered or seeded, such as by titanium-copper or electroless copper seeding. The conductive layer 15 may also be plated to a target thickness (e.g., to about 25 µm, to about 50 µm, to about 75 µm, or to another suitable thickness). In some embodiments, the conductive layer 15 may include copper (Cu). In some embodiments, the conductive layer 12 is omitted, and the conductive layer 15 provides electrical and/or thermal communication to the die 10 and/or the electrode 102. In some embodiments, the conductive layer 15 helps dissipate the heat generated by the die 10 at a higher rate than would a similarly positioned encapsulant layer 14 (e.g. than would the encapsulant layer 14, were it similarly positioned). That is, the conductive layer 15 may function as a heat sink. In embodiments in which the conductive layer 12 is omitted and the electrode 102 is in direct contact with the conductive layer 15, the rate at which electrical currents and/or heat may transfer between the die 10 and the conductive layer 15 is positively correlated with the area or amount of direct contact between the electrode 102 and the conductive layer 15. In some embodiments, the conductive layer 15 covers substantially the entire top surface of the electrode 102. In some embodiments, a side surface of the conductive layer 15 is substantially coplanar with the lateral surface 14c of the encapsulant layer 14.

A seed layer 151 may be disposed between the encapsulant layer 14 and the conductive layer 15. The seed layer 151 may be omitted in accordance with some embodiments of the present disclosure (e.g. as in the semiconductor device 1*b* shown in FIG. 1B). In some embodiments, the seed layer 151 is in contact with the conductive layer 12. The seed layer 151 is conductive and may include, for example, Cu or a titanium-copper alloy (e.g. TiCu). Manufacture of the conductive layer 15 may be facilitated by the seed layer 151. The conductive layer 15 and the seed layer 151 may include substantially the same materials, in which case a boundary therebetween might not be readily discernable. The conductive layer 15 and the seed layer 151 may include different materials.

The patterned conductive layer 16 is disposed on the patterned conductive layer 13. The patterned conductive layer 16 may include a metal, such as copper, aluminum, silver or gold. The patterned conductive layer 16 may include a first portion 16*v* and a second portion 16*t*. The first portion 16*v* is formed in one or more openings or recesses in the adhesive layer 11 and provides for electrical and/or thermal communication to the electrode 101, which is exposed from the adhesive layer 11 by the openings or recesses. In some embodiments, the first portion 16*v* may include a conductive via or a conductive interconnect. In some embodiments, the second portion 16*t* may include one or more traces disposed on the semiconductor package device 1.

The seed layer 161 is formed or disposed between the exposed electrode 101 and the patterned conductive layer 16. The seed layer 161 is disposed between the adhesive layer 11 and the patterned conductive layer 16. The seed layer 161 is disposed between the patterned conductive layer 13 and the patterned conductive layer 16. The seed layer 161 may be omitted in accordance with some embodiments of the present disclosure (e.g. as in the semiconductor device 1*b* shown in FIG. 1B). The seed layer 161 may include a metal, such as copper, aluminum, silver or gold, and may include any suitable materials that facilitate the manufacture of the patterned conductive layer 16. In some embodiments, the patterned conductive layer 13, the patterned conductive layer 16 and/or the seed layer 161 may include a substantially same material, in which case a boundary between the layers of the same material may not be readily discernable. The patterned conductive layer 13, the patterned conductive layer 16 and/or the seed layer 161 may also function as heat sink, and a suitable material (e.g. Cu) may be included in the patterned conductive layer 16 and/or the seed layer 161 to help provide for heat sink characteristics.

FIG. 2A, FIG. 2B, FIG. 2C, FIG. 2D, FIG. 2E and FIG. 2F illustrate a method of manufacturing a semiconductor package device in accordance with some embodiments of the present disclosure.

Figure 2A:
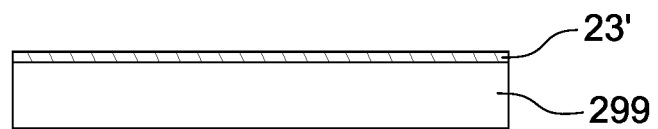
FIG. 2A, FIG. 2B, FIG. 2C, FIG. 2D, FIG. 2E and FIG. 2F illustrate a method of manufacturing a semiconductor package device in accordance with some embodiments of the present disclosure.

Referring to FIG. 2A, a carrier 299 is provided, and a conductive layer 23' is disposed on the carrier 299. The carrier 299 may include a laminate, a layer, or a stack such as copper/aluminum/copper stack or a copper/nickel/iron alloy/copper stack. The stack may be readily peelable or otherwise removeable. The carrier 299 may have a low coefficient of thermal expansion (CTE). The conductive layer 23' may include any suitable conductive material, such as aluminum, copper, silver, or gold. The conductive layer 23' may be, for example, plated or sputtered.

Figure 2B:
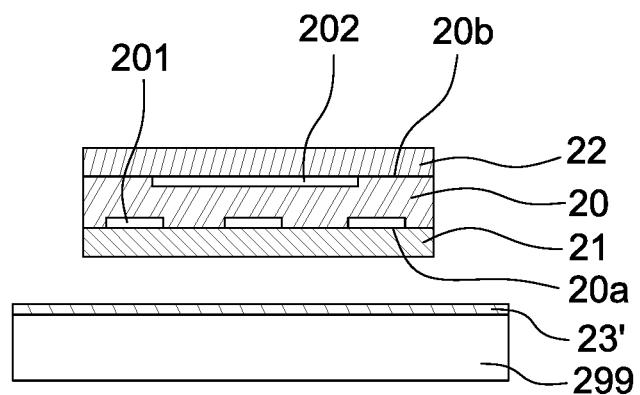

Referring to FIG. 2B, a die 20, an adhesive layer 21 and a conductive layer 22 are provided. The die 20 has a surface 20*a* and a surface 20*b* opposite to the surface 20*a*. At least one electrode 201 is provided on or at the surface 20*a* and at least one electrode 202 is provide on or at the surface 20*b*. In some embodiments, the conductive layer 22 may be omitted. The size of the electrode 201 may have be substantially the same as that of the electrode 202.

Figure 2C:
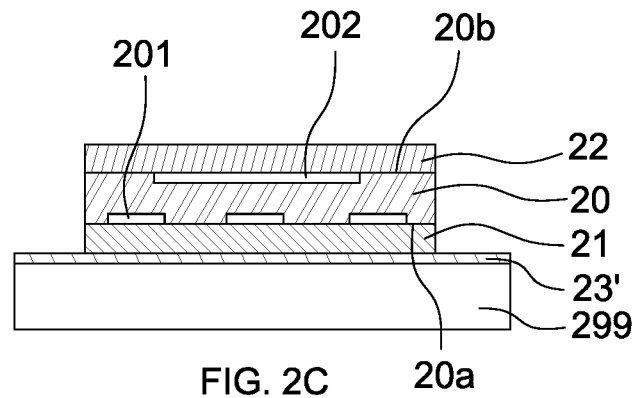

Referring to FIG. 2C, the die 20 and the conductive layer 22 are attached to the carrier 299 by the adhesive layer 21. In some embodiments, the adhesive layer 21 is disposed on the conductive layer 23' or the carrier 299, and then the die 20 and the conductive layer 22 are disposed on the adhesive layer 21. In some embodiments, the die 20 is disposed on the adhesive layer 21, and then the conductive layer 22 is disposed on the die 20. Other permutations of this process may additionally or alternatively be performed. In some embodiments, the conductive layer 22 may be a backside metal layer and may include any suitable metal, alloy, or combination thereof, such as nickel-silver or copper-nickel. The conductive layer 22 may be disposed by electroplating, sputtering, or suitable techniques, or may be disposed on the die 20 as a sheet or film of metal.

Although FIG. 2A, FIG. 2B and FIG. 2C show that the die 20, the adhesive layer 21, the conductive layer 22 and the conductive layer 23' are disposed on one side of the carrier 299, any one of them may be disposed on an opposite side of the carrier 299, or on both sides of the carrier 299, using similar or different techniques.

Figure 2D:
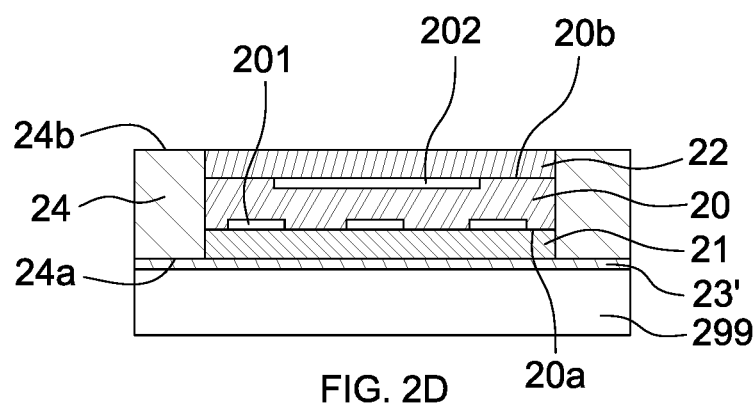

Referring to FIG. 2D, an encapsulant layer 24 including a surface 24*a* and a surface 24*b* opposite to the surface 24*a* is provided to encapsulate the die 20, the adhesive layer 21 and the conductive layer 22. As shown in FIG. 2D, the electrode 202 is at least partially exposed from the encapsulant layer 24. In some embodiments, substantially the entirety of the electrode 202 is exposed from the encapsulant layer 24. In some embodiments, the surface 24*b* may be substantially coplanar with a top surface of the conductive layer 22 or the surface 20*b* of the die 20. In some embodiments, the top surface of the conductive layer 22 may be recessed below the surface 24*b*. The die 20 is encapsulated by the encapsulant layer 24 (e.g., by a molding compound), and thus in some embodiments lamination of other protective films (such as Pre-preg protective films) can be omitted.

The die attachment operation can involve a high temperature (e.g. to cure the adhesive layer 21). Since the die 20 is encapsulated after having been attached, the encapsulant layer 24 is not directly subjected to the high temperature and thus does not experience a temperature higher than, for example, the Glass Transition Temperature (Tg) of the material of the encapsulant layer 24. Thus, the encapsulant layer 24 might not soften and may firmly hold the encapsulated die 20 in subsequent manufacturing processes, thereby decreasing shift of the die 20 and improving its alignment with other parts of the semiconductor package device, as well as its registration.

Figure 2E:
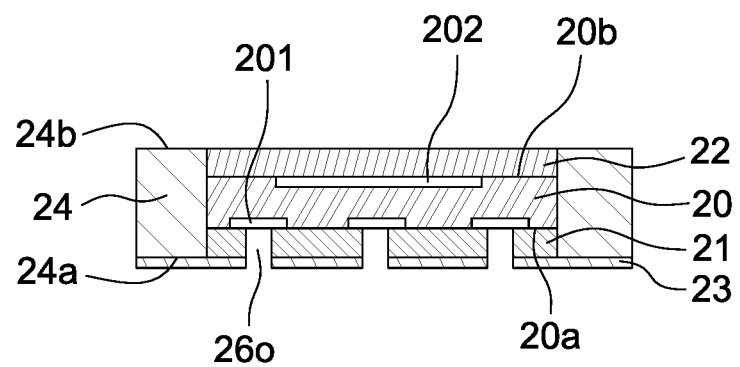

Referring to FIG. 2E, the carrier 299 is removed. At least one opening 26*o* that exposes the corresponding electrode 201 is formed (e.g. in the adhesive layer 21 and/or in the conductive layer 23'). The opening 26*o* may be formed by removing a portion of the conductive layer 23' and then removing a portion of the adhesive layer 21. The two portions may be removed in one, two or more stages. The opening 26*o* may be formed by, for example, photolithography techniques, laser ablation, etching and/or drilling. Since the material of the conductive layer 23' can differ from that of the adhesive layer 21, it can be advantageous to employ different techniques to remove portions of different layers to form the opening 26*o*. After the formation of the opening 26*o*, the conductive layer 23', which is now patterned, is referred to as a patterned conductive layer 23.

The opening 26*o* is formed to expose the electrode 201 after the die 20 has been attached. In this way, the location at which the electrode 201 is exposed may be better controlled, thereby improving alignment and registration.

Figure 1B:
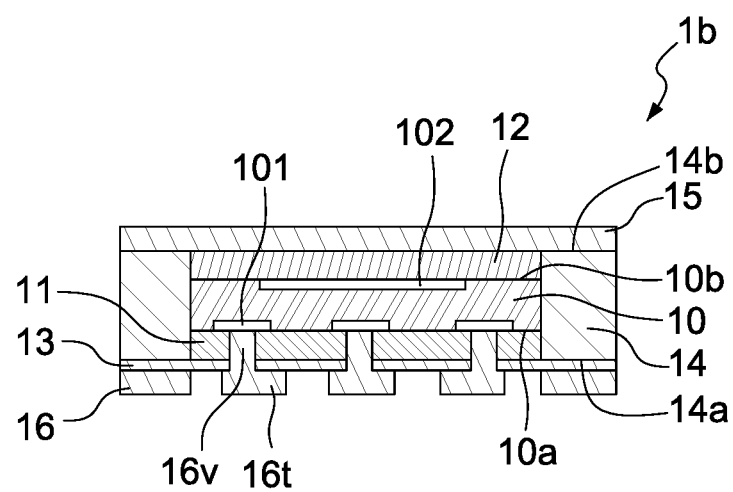

Afterwards, a conductive layer may be formed on the encapsulant layer 24 and a patterned conductive layer may be formed on the patterned conductive layer 23 to arrive at, for example, a semiconductor package device 1b as shown in FIG. 1B. The conductive layer may be formed by any suitable techniques, such as sputtering/filling. The patterned conductive layer may be formed by suitable techniques, such as sputtering, followed by suitable patterning techniques, such as photolithography, drilling, laser ablation, and etching (such as, for example, tent etch stripping and/or strip flash etching).

Figure 2F:
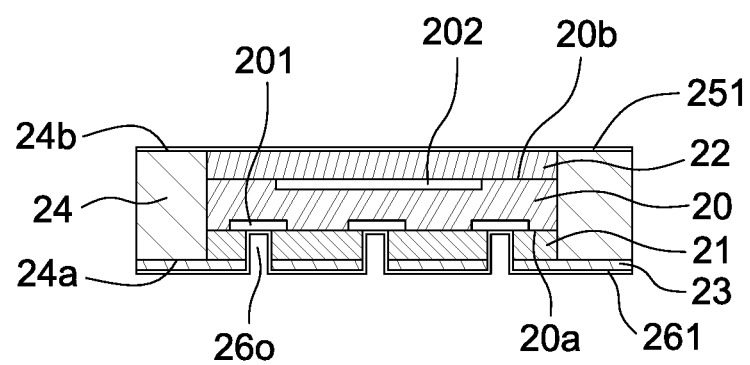

FIG. 2F illustrates another stage that may be performed after the stage illustrated in FIG. 2E. A seed layer 251 and/or seed layer 261 may be formed. The seed layers 251, 261 are conductive and may facilitate subsequent manufacturing processes, such as the formation of conductive layers thereon. As shown in FIG. 2F, the seed layer 261 may be formed on the sidewalls of the adhesive layer 21 and/or the patterned conductive layer 23 and/or formed on the exposed electrode 201.

Afterwards, a conductive layer may be formed on the seed layer 251 and a patterned conductive layer may be formed on the seed layer 261 to arrive at, for example, a semiconductor package device 1 as shown in FIG. 1A. The conductive layer may be formed by any suitable techniques, such as electro-plating or electroless-plating (which the seed layer 251 may facilitate) and sputtering. The patterned conductive layer may be formed by suitable techniques, such as electro-plating or electroless-plating (which the seed layer 261 may facilitate) and sputtering/filling, followed by suitable patterning techniques, such as photolithography, drilling, laser ablation, and etching (such as, for example, tent etch stripping and/or strip flash etching). In some embodiments, the formation of the conductive layer and any or all parts of the patterned conductive layer (such as vias and traces) may be performed in a single operation.

Figure 3:
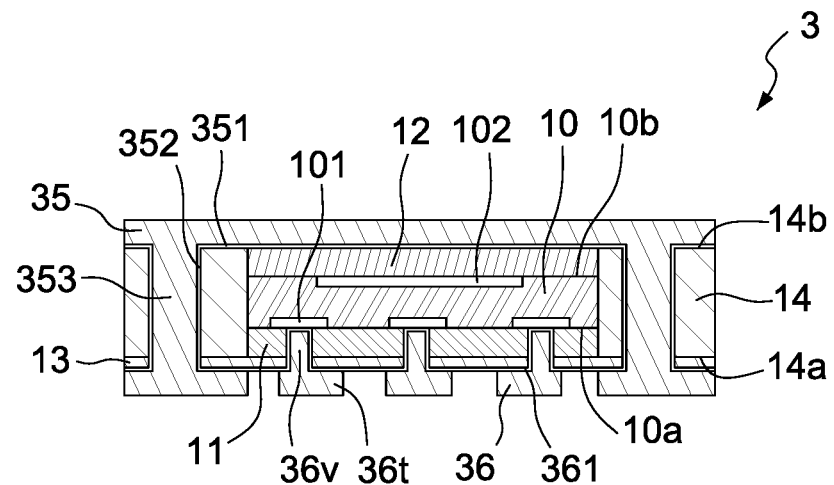
FIG. 3 illustrates a cross-sectional view of some embodiments of a semiconductor package device in accordance with a second aspect of the present disclosure.

FIG. 3 illustrates a cross-sectional view of some embodiments of a semiconductor package device 3 in accordance with a second aspect of the present disclosure. The semiconductor package device 3 includes a die 10, an adhesive layer 11, a conductive layer 12, a patterned conductive layer 13, an encapsulant layer 14, a conductive layer 35, and a patterned conductive layer 36.

One difference between the semiconductor package device 3 shown in FIG. 3 and the semiconductor package device 1 shown in FIG. 1A is that the semiconductor package device 3 includes a conductive interconnect 353, which electrically connects the conductive layer 35 and the patterned conductive layer 36. The number and width of the conductive interconnect 353 may be set to appropriate values to provide, for example, a desired level of electrical and/or thermal communication (such as electrical current and heat dissipation) between, for example, the conductive layer 35 and the patterned conductive layer 36.

A seed layer 351 may be disposed between the encapsulant layer 14 and the conductive layer 35, or may be omitted in accordance with some embodiments of the present disclosure. In some embodiments, the seed layer 351 is in contact with the conductive layer 12. The seed layer 351 is conductive and may include Cu or TiCu. The manufacture of the conductive layer 35 may be facilitated by the seed layer 351. The conductive layer 35 and the seed layer 351 may include substantially the same materials, in which case the boundary therebetween might not be readily discernable. The conductive layer 35 and the seed layer 351 may include different materials.

A seed layer 352 may be disposed between the encapsulant layer 14 and the conductive interconnect 353, or may be omitted in accordance with some embodiments of the present disclosure. The manufacture of the conductive interconnect 353 may be facilitated by the seed layer 352. The seed layer 352 is conductive and may include Cu or TiCu. The seed layers 351 and 352 may include substantially the same materials, or different materials.

The patterned conductive layer 36 is disposed on the patterned conductive layer 13. The patterned conductive layer 36 may include a metal, such as copper, aluminum, silver or gold. The patterned conductive layer 36 may include a first portion 36v and a second portion 36t. The first portion 36v is disposed in the opening of the adhesive layer 11 and provides for electrical and/or thermal communication to the electrode 101 exposed from the adhesive layer 11. In some embodiments, the first portion 36v may include a conductive via or a conductive interconnect. In some embodiments, the second portion 36t may include one or more traces disposed on the semiconductor package device 3.

The seed layer 361 is formed or disposed between the exposed electrode 101 and the patterned conductive layer 36. The seed layer 361 is disposed between the adhesive layer 11 and the patterned conductive layer 36. The seed layer 361 is disposed between the patterned conductive layer 13 and the patterned conductive layer 36. The seed layer 361 may be omitted in accordance with some embodiments of the present disclosure. The seed layer 361 may include a metal, such as copper, aluminum, silver or gold, and may include any suitable materials that facilitate the manufacture of the patterned conductive layer 36. In some embodiments, the patterned conductive layer 13, the patterned conductive layer 36 and/or the seed layer 361 may include a substantially same material, in which case a boundary between the layers of the same material may not be readily discernable.

FIG. 4A, FIG. 4B, FIG. 4C, FIG. 4D, FIG. 4E and FIG. 4F illustrate a method of manufacturing a semiconductor package device in accordance with some embodiments of the present disclosure.

The processes shown in FIG. 4A, FIG. 4B, FIG. 4C and FIG. 4D are similar to those shown in FIG. 2A, FIG. 2B, FIG. 2C and FIG. 2D and thus are not described in detail.

Figure 4A:
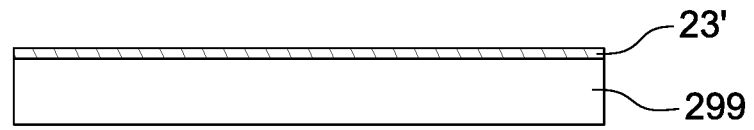
FIG. 4A, FIG. 4B, FIG. 4C, FIG. 4D, FIG. 4E and FIG. 4F illustrate a method of manufacturing a semiconductor package device in accordance with some embodiments of the present disclosure.
Figure 4B:
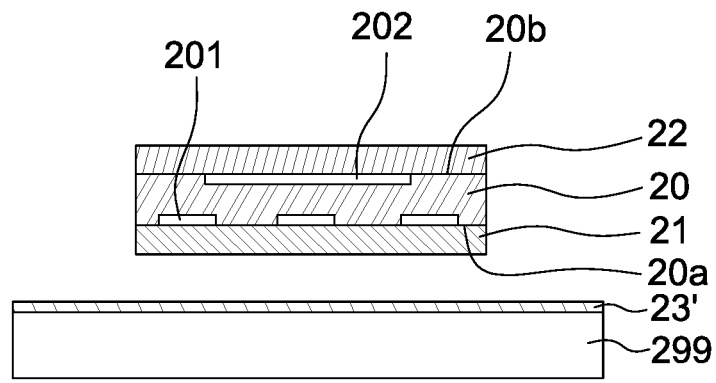
Figure 4C:
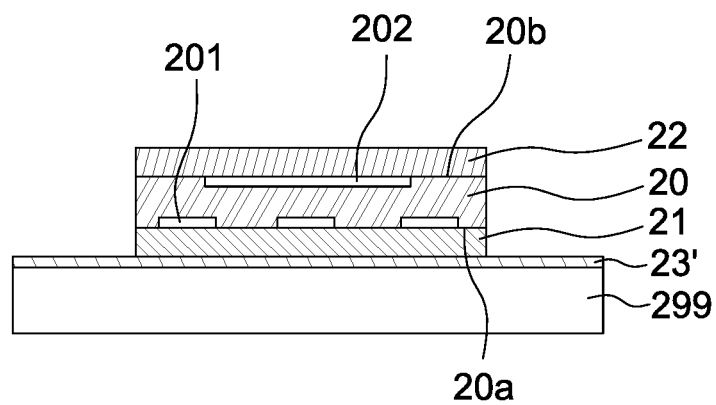
Figure 4D:
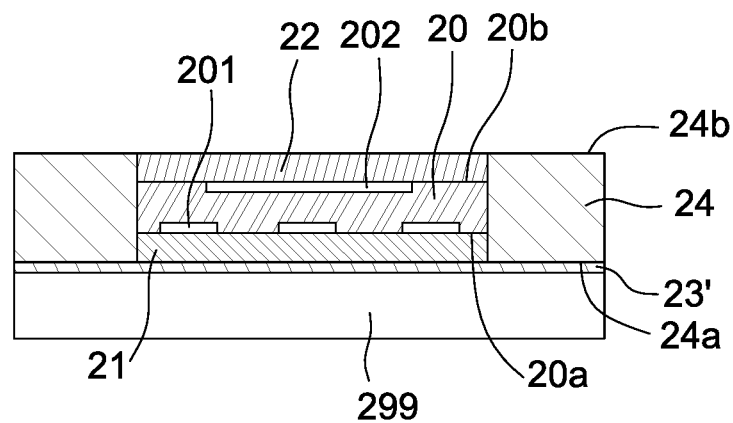
Figure 4E:
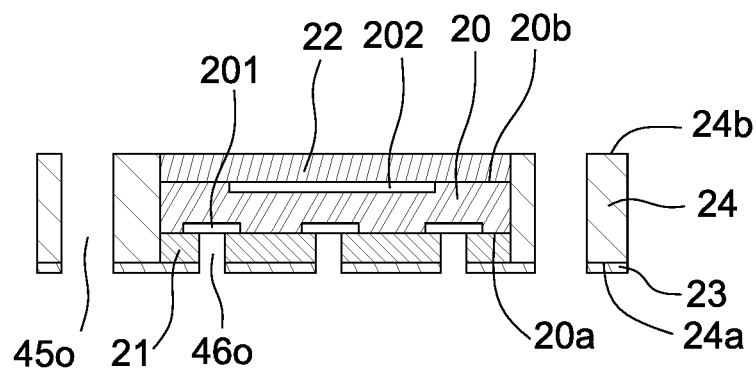

Referring to FIG. 4E, the carrier 299 is removed. At least one opening 45o is formed in the encapsulant layer 24 and the conductive layer 23', and at least one opening 46o is formed in the adhesive layer 21 and the conductive layer 23'. After the formation of the openings 45o and 46o, the conductive layer 23' is patterned and is thus referred to as a patterned conductive layer 23. The openings 45o may be formed by removing a portion of the conductive layer 23' and removing a portion of the encapsulant layer 24. The two portions may be removed in one, two or more stages. The opening 46o may be formed by removing a portion of the conductive layer 23' and then removing a portion of the adhesive layer 21. The two portions may be removed in one, two or more stages. The openings 45o and 46o may be formed by, for example, photolithography techniques, laser ablation, etching and/or drilling. Since the material of the conductive layer 23', the encapsulant layer 24 and the adhesive layer 21 can differ from each other, it can be advantageous to employ different techniques to remove portions of different layers to form the openings 45o and 46o.

The opening 46o is formed to expose the electrode 201 after the die 20 has been attached. That way, the location at which the electrode 201 is exposed may be better controlled, thereby improving alignment and registration.

Figure 4F:
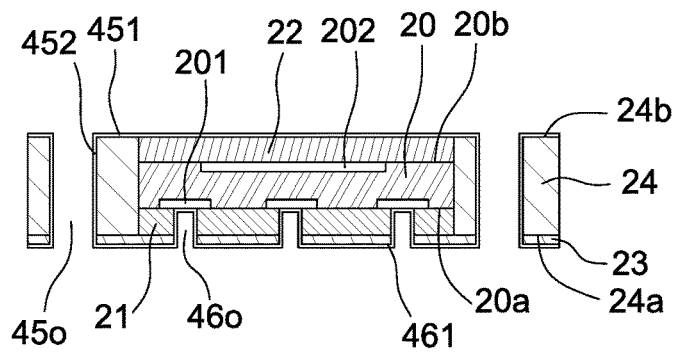

Referring to FIG. 4F, a seed layer 451, seed layer 452 and/or seed layer 461 may be formed. The seed layers 451, 452, 461 are conductive and may facilitate subsequent manufacturing processes, such as the formation of conductive layers thereon. As shown in FIG. 4F, the seed layer 461 may be formed on the sidewalls of the adhesive layer 21 and/or the patterned conductive layer 23 and/or formed on the exposed electrode 201.

Afterwards, a conductive layer may be formed on the seed layer 451, a patterned conductive layer may be formed on the seed layer 461, and a conductive interconnect may be formed in the opening 45o to arrive at, for example, a semiconductor package device 3 as shown in FIG. 3. The conductive layer and conductive interconnect may be formed by any suitable techniques, such as electro-plating or electroless-plating (which the seed layer 451, 452 may facilitate) and sputtering/filling. The patterned conductive layer may be formed by suitable techniques, such as electro-plating or electroless-plating (which the seed layer 461 may facilitate) and sputtering/filling, followed by suitable patterning techniques, such as photolithography, drilling, laser ablation, and etching (such as, for example, tent etch stripping and/or strip flash etching). In some embodiments, the formation of the conductive layer, any or all parts of the patterned conductive layer (such as vias and traces) and the conductive interconnect may be performed in a single operation.

In some embodiments, the seed layers 451, 452, 461 are not formed, in which case the conductive layer, the patterned conductive layer and the conductive interconnect may be formed by sputtering followed by suitable patterning techniques.

Figure 5:
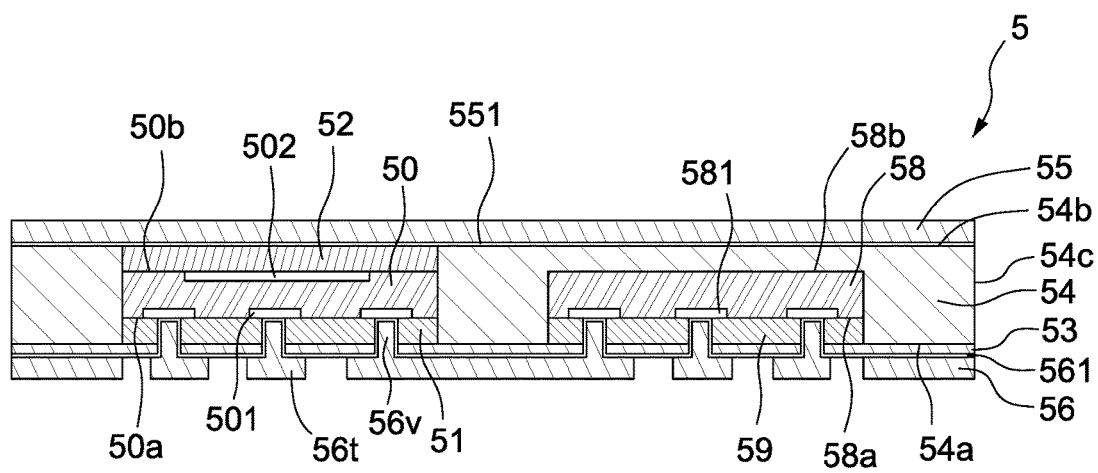
FIG. 5 illustrates a cross-sectional view of some embodiments of a semiconductor package device in accordance with a third aspect of the present disclosure.

FIG. 5 illustrates a cross-sectional view of some embodiments of a semiconductor package device 5 in accordance with a third aspect of the present disclosure. The semiconductor package device 5 includes a die 50, an adhesive layer 51, a conductive layer 52, a patterned conductive layer 53, an encapsulant layer 54, a conductive layer 55, a patterned conductive layer 56, a die 58, and an adhesive layer 59. Although FIG. 5 depicts two dies 50, 58, the semiconductor package device 5 may include more than two dies, such as three, four, five, six, seven or more.

The die 50 may include an electrode 501 disposed on or at a surface 50a of the die 50 and an electrode 502 disposed on or at the surface 50b. The electrodes 501, 502 may provide for external electrical communication with the die 50. In some embodiments, the electrodes 501, 502 may include contacts or pads. In some embodiments, more than one electrode 501 may be disposed on or at the surface 50a. In some embodiments, more than one electrode 502 may be disposed on or at the surface 50b. The size of the electrode 501 may differ from that of the electrode 502. The size of the electrode 501 may be substantially the same as that of the electrode 502.

The die 50 has the surface 50a and another surface 50b opposite to the surface 50a. In some embodiments, the surface 50a may be referred to as a front side, and the surface 50b may be referred to as a back side. However, this description is merely for convenience and is not intended to limit any aspects of the surfaces 50a, 50b. The die 50 may include semiconductor materials, such as Si and III-V materials, and may be doped with other suitable materials. The die 50 may include a semiconductor substrate, one or more integrated circuit devices and one or more overlying interconnection structures. The integrated circuit devices may include active devices such as transistors and/or passive devices such resistors, capacitors, inductors, or a combination thereof. In some embodiments, the die 50 may include a power device, such as a power transistor, a power diode or an IGBT. The power device may consume more electric current or power and thus dissipate more thermal energy than non-power devices (such as logic components and/or controllers).

The adhesive layer 51 is disposed on the surface 50a of the die 50 and may serve to attach the die 50 to other parts of the semiconductor package device 5 (e.g., to the patterned conductive layer 53). In some embodiments, the adhesive layer 51 may be an adhesive layer such as a gel-type or film-type adhesive layer. The adhesive layer 51 may include a thermoset resin. The adhesive layer 51 may include a thermoplastic resin. The adhesive layer 51 may include one or more of the following: a resin, a polyester resin, a polyether resin, an epoxy resin and a polyolefin composition. The adhesive layer 51 may be thicker or thinner than the die 50. The adhesive layer 51 may be disposed within a perimeter of the die 50. The adhesive layer 51 may include one or more openings, which may expose the electrode 501.

The conductive layer 52 is disposed on the surface 50b of the die 50. The conductive layer 52 is optional. The conductive layer 52 may be omitted in accordance with some embodiments of the present disclosure. The electrode 502 may be in contact with the conductive layer 52 (e.g. a portion of the electrode 502 may be in contact with the conductive layer 52, or substantially an entire surface (e.g. a top surface) of the electrode 502 may be in contact with the conductive layer 52). In some embodiments, the conductive layer 52 may be a backside metal layer. In some embodiments, the conductive layer 52 may be used to provide improved thermal and/or electrical transmission characteristics, such as compared to solder bonding or TLP, each of which includes higher electrical and thermal resistance. In some embodiments, the conductive layer 52 may operate as a heat slug or heat sink or heat spreader. Additionally, some methods of providing the conductive layer 52, such as plating, provide for reduced thermal stresses during manufacture because, for example, a plating technique can be performed at moderate temperature (for example, less than about 50 degrees ° C., such as less than about 45° C., less than about 40° C., or less than about 35° C.) as opposed to soldering (which can be performed at, for example, temperatures greater than about 170° C., such as greater than about 180° C., greater than about 190° C., or greater than about 200° C.) or TLP (e.g., which can be performed at, for example, temperatures up to about 450° C. or greater). Further, solder or TLP reflow can cause the die 50 to shift and thereby increase misalignment. The improved electrical transmission characteristics, such a lower electrical resistance of the conductive layer 52, can be beneficial, for example, when the conductive layer 52 is connected in a power or ground path, or in a high current path.

The die 58 has a surface 58a and another surface 58b opposite to the surface 58a. In some embodiments, the surface 58a may be referred to as a front side, and the surface 58b may be referred to as a back side. However, this description is merely for convenience and is not intended to limit any aspects of the surfaces 58a, 58b. The die 58 may include semiconductor materials, such as Si and group III-V materials, and may be doped with other materials of interest. The die 58 may include a semiconductor substrate, one or more integrated circuit devices and one or more overlying interconnection structures; the integrated circuit devices may include active devices such as transistors and/or passive devices such resistors, capacitors, inductors, or a combination thereof. In some embodiments, the die 58 may be a non-power device, such as a logic component and/or controller. The non-power device may consume less electric current or power and thus dissipate less thermal energy than power devices (such as a power transistor, a power diode or an IGBT).

The die 58 may include an electrode 581 disposed on or at the surface 58*a*. The electrode 581 may provide for external electrical communication with the die 58. In some embodiments, the electrode 581 may include a contact or pad. In some embodiments, more than one electrode 581 may be disposed on or at the surface 58*a*.

The encapsulant layer 54 has a surface 54*a*, a surface 54*b* opposite to the surface 54*a*, and a lateral surface 54*c* extending between the surfaces 54*a*, 54*b*. In some embodiments, the encapsulant layer 54 may include, but is not limited to, an epoxy resin having fillers, a molding compound (e.g., an epoxy molding compound or other molding compound), a polyimide, a phenolic compound or material, a material with a silicone dispersed therein, or a combination thereof.

The encapsulant layer 54 may encapsulate the die 50, the adhesive layer 51, the conductive layer 52, the die 58, and the adhesive layer 59. The electrode 502 (e.g. a top surface of the electrode 502) may be exposed, in whole or in part, from the encapsulant layer 54. Such exposure can provide for the electrode 502 being in electrical and/or thermal communication with parts or components of the semiconductor package device 5 other than the encapsulant layer 54 that may have more desirable electrical and/or thermal characteristics than does the encapsulant layer 54 (such as, in some implementations, lower electrical and/or thermal resistances). In some embodiments, the more the electrode 502 is exposed to parts or components of the semiconductor package device 5 having lower electrical and/or thermal resistances, the more facilitated is the electrical and thermal communication therebetween.

The surface 54*a* may be substantially coplanar with the surface 50*a*, or may be substantially coplanar with a bottom surface of the adhesive layer 51. In some embodiments, the surface 54*b* may be substantially coplanar with the surface 50*b* of the die 50 or, if the conductive layer 52 is included in the semiconductor package device 5, with a surface of the conductive layer 52. In some embodiments, one or more surfaces of the adhesive layers 51 and 59 may be recessed from the surface 54*a*. In some embodiments, the surface 50*b* and/or the surface of the conductive layer 52 may be recessed from the surface 54*b*. In some embodiments, the surface 58*b* is disposed below or under the surface 54*b*.

The conductive layer 55 is disposed over the encapsulant layer 54, the die 50 and the die 58, and may be sputtered or seeded, such as by titanium-copper or electroless copper seeding. The conductive layer 55 may also be plated to a target thickness (e.g., to about 25 μm, to about 50 μm, to about 75 μm, or to another suitable thickness). In some embodiments, the conductive layer 55 may include Cu. In some embodiments, the conductive layer 52 is omitted, and the conductive layer 55 provides electrical and/or thermal communication to the die 50 and/or the electrode 502. In some embodiments, the conductive layer 55 helps dissipate the heat generated by the die 50 at a higher rate than would a similarly positioned encapsulant layer (e.g. than would the encapsulant layer 54, were it similarly positioned). That is, the conductive layer 55 may function as a heat sink. In embodiments in which the conductive layer 52 is omitted and the electrode 502 is direct contact with the conductive layer 55, the rate at which electrical currents and/or heat may transfer between the die 50 and the conductive layer 55 is positively correlated with the area/amount of direct contact between the electrode 502 and the conductive layer 55.

A seed layer 551 may be disposed between the encapsulant layer 54 and the conductive layer 55. The seed layer 551 may be omitted in accordance with some embodiments of the present disclosure. In some embodiments, the seed layer 551 is in contact with the conductive layer 52. The seed layer 551 is conductive and may include Cu or TiCu. The manufacture of the conductive layer 55 may be facilitated by the seed layer 551. The conductive layer 55 and the seed layer 551 may include substantially the same materials, in which case the boundary therebetween might not be readily discernable. The conductive layer 55 and the seed layer 551 may include different materials.

The patterned conductive layer 56 is disposed on the patterned conductive layer 53. The patterned conductive layer 56 may include a metal, such as copper, aluminum, silver or gold. The patterned conductive layer 56 may include a first portion 56*v* and a second portion 56*t*. The first portion 56*v* is disposed in openings or recesses defined by the adhesive layers 51 and 59, and provides for electrical and/or thermal communication to the electrodes 501 and 581, which are respectively exposed from the adhesive layers 51 and 59. In some embodiments, the first portion 56*v* may include a conductive via or a conductive interconnect. In some embodiments, the second portion 56*t* may include one or more traces disposed on the semiconductor package device 5. In some embodiments, the patterned conductive layer 53 and/or the patterned conductive layer 56 provide electrical and thermal communication between the dies 50 and 58.

The seed layer 561 is formed or disposed between the exposed electrode 501 and the patterned conductive layer 56 and/or between the exposed electrode 581 and the patterned conductive layer 56. The seed layer 561 is disposed between the adhesive layers 51 and 59 and the patterned conductive layer 56. The seed layer 561 is disposed between the patterned conductive layer 53 and the patterned conductive layer 56. The seed layer 561 may be omitted in accordance with some embodiments of the present disclosure. The seed layer 561 may include a metal, such as copper, aluminum, silver or gold, and may include any materials that facilitates the manufacture of the patterned conductive layer 56. In some embodiments, the patterned conductive layer 53, the patterned conductive layer 56 and/or the seed layer 561 may include a substantially same material, in which case a boundary between the layers of the same material may not be readily discernable. The patterned conductive layer 53, the patterned conductive layer 56 and/or the seed layer 561 may also function as heat sink, and a suitable material (e.g. Cu) may be included in the patterned conductive layer 53, the patterned conductive layer 56 and/or the seed layer 561 to help provide for heat sink characteristics.

FIG. 6A, FIG. 6B, FIG. 6C, FIG. 6D, FIG. 6E and FIG. 6F illustrate a method of manufacturing a semiconductor package device in accordance with some embodiments of the present disclosure.

Figure 6A:
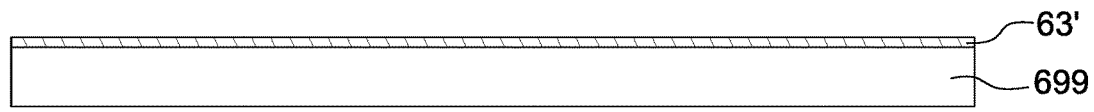
FIG. 6A, FIG. 6B, FIG. 6C, FIG. 6D, FIG. 6E and FIG. 6F illustrate a method of manufacturing a semiconductor package device in accordance with some embodiments of the present disclosure.

Referring to FIG. 6A, a carrier 699 is provided, and a conductive layer 63' is disposed on the carrier 699. The carrier 699 may include a laminate, a layer, or a stack such as a copper/aluminum/copper stack or a copper/nickel/iron alloy/copper stack. The stack may be readily peelable or otherwise removeable. The carrier 699 may have a low CTE.

The conductive layer 63' may include any suitable conductive material, such as aluminum, copper, silver, or gold. The conductive layer 63' may be, for example, plated or sputtered.

Figure 6B:
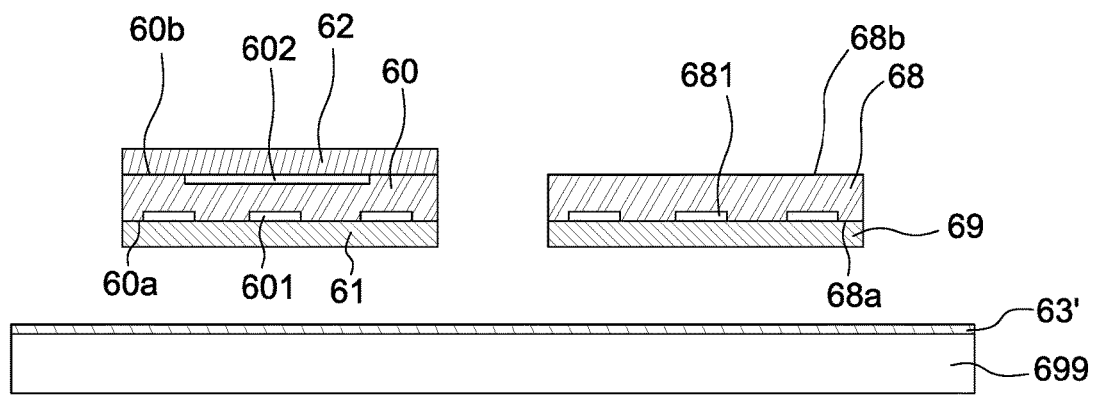

Referring to FIG. 6B, a die 60, an adhesive layer 61 and a conductive layer 62 are provided. A die 68 and an adhesive layer 69 may also be provided. The die 60 has a surface 60a and a surface 60b opposite to the surface 60a. At least one electrode 601 is provided on or at the surface 60a and at least one electrode 602 is provided on or at the surface 60b. In some embodiments, the conductive layer 62 may be omitted. The size of the electrode 601 may be substantially the same as that of the electrode 602. In other embodiments, the size of the electrode 601 may differ from that of the electrode 602. The die 68 has a surface 68a and a surface 68b opposite to the surface 68a. At least one electrode 681 is provided on or at the surface 68a.

Figure 6C:
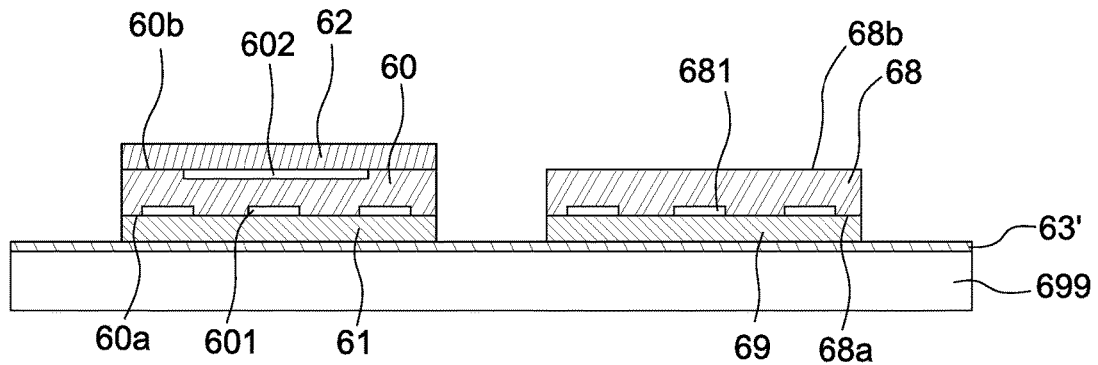

Referring to FIG. 6C, the die 60 and the conductive layer 62 are attached to the carrier 699 by the adhesive layer 61. The die 68 is attached to the carrier 699 by the adhesive layer 69. In some embodiments, the adhesive layers 61 and 69 are disposed on the conductive layer 63' or the carrier 699, and then the dies 60 and 68 and the conductive layer 62 are respectively disposed on the adhesive layers 61 and 69. In some embodiments, the die 60 is disposed on the adhesive layer 61, and then the conductive layer 62 is disposed on the die 60. Other permutations of this process may additionally or alternatively be performed. In some embodiments, the conductive layer 62 may be a backside metal layer and may include any suitable metal, alloy, or combination thereof, such as nickel-silver or copper-nickel. The conductive layer 62 may be disposed by electroplating, sputtering, or suitable techniques, or may be disposed on the die 60 as a sheet or film of metal.

Although FIG. 6A, FIG. 6B and FIG. 6C show that the die 60, the adhesive layer 61, the conductive layer 62, the conductive layer 63', the die 68 and the adhesive layer 69 are disposed on one side of the carrier 699, any one of them may be disposed on an opposite side of the carrier 699, or on both sides of the carrier 699, using similar or different techniques.

Figure 6D:
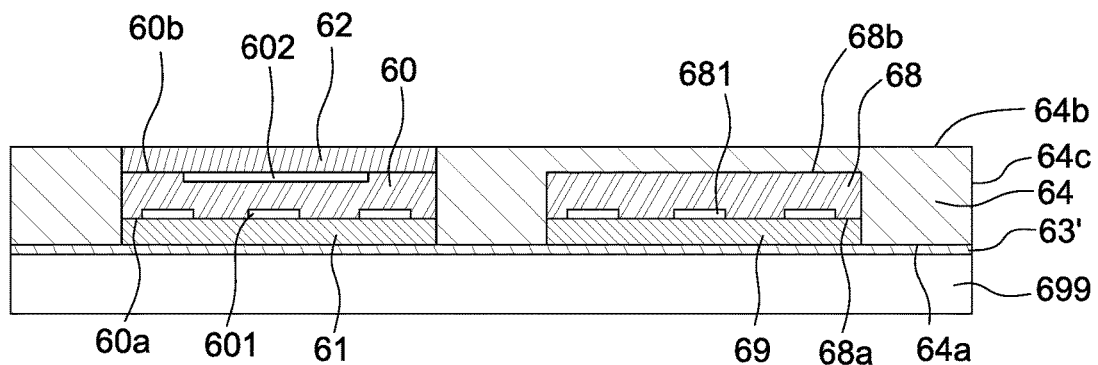

Referring to FIG. 6D, an encapsulant layer 64 having a surface 64a and a surface 64b is provided to encapsulate the die 60, the adhesive layer 61, the conductive layer 62, the die 68 and the adhesive layer 69. As shown in FIG. 6D, the electrode 602 is at least partially exposed from the encapsulant layer 64. In some embodiments, substantially the entirety of a top surface of the electrode 602 is exposed from the encapsulant layer 64. In some embodiments, the surface 64b may be substantially coplanar with a top surface of the conductive layer 62 or the surface 60b of the die 60. In some embodiments, the conductive layer 62 may be recessed below the surface 64b. In some embodiments, the surface 68b is below or under the surface 64b. The dies 60 and 68 are encapsulated by the encapsulant layer 64 (e.g., by a molding compound), and thus in some embodiments lamination of other protective films (such as Pre-preg protective films) can be omitted.

The die attachment operation can involve a high temperature (e.g. to cure the adhesive layers 61 and 69). Since the dies 60 and 68 are encapsulated after having been attached, the encapsulant layer 64 is not directly subjected to the high temperature involved in curing the adhesive layers 61 and 69, and thus is not directly subjected to a temperature higher than, for example, the Glass Transition Temperature (Tg) of the material of the encapsulant layer 64. In other words, the encapsulant layer 64 may not soften and may firmly hold the encapsulated dies 60 and 68 in subsequent manufacturing processes, thereby decreasing shift of the dies 60 and 68 and improving their alignment with other parts of the semiconductor package device and their registration.

Figure 6E:
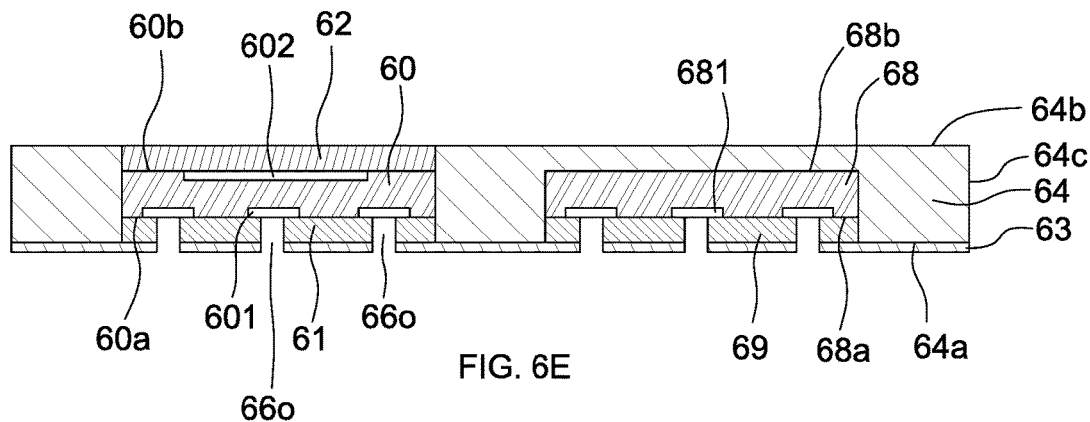

Referring to FIG. 6E, the carrier 699 is removed. At least two openings 66o that respectively expose the electrodes 601 and 681 are formed. The openings 66o may be formed by removing a portion of the conductive layer 63' and then removing a portion of the adhesive layers 61 and 69. The portions may be removed in one, two or more stages. The openings 66o may be formed by, for example, photolithography techniques, laser ablation, etching and/or drilling. Since the material of the conductive layer 63' can differ from that of the adhesive layers 61 and 69, it can be advantageous to employ different techniques to remove portions of different layers to form the openings 66o. After the formation of the openings 66o, the conductive layer 63', which is now patterned, is referred to as a patterned conductive layer 63.

The openings 66o are formed to expose the electrodes 601 and 681 after the dies 60 and 68 have been attached. In this way, the locations at which the electrodes 601 and 681 are exposed may be better controlled, thereby improving alignment and registration.

Figure 6F:
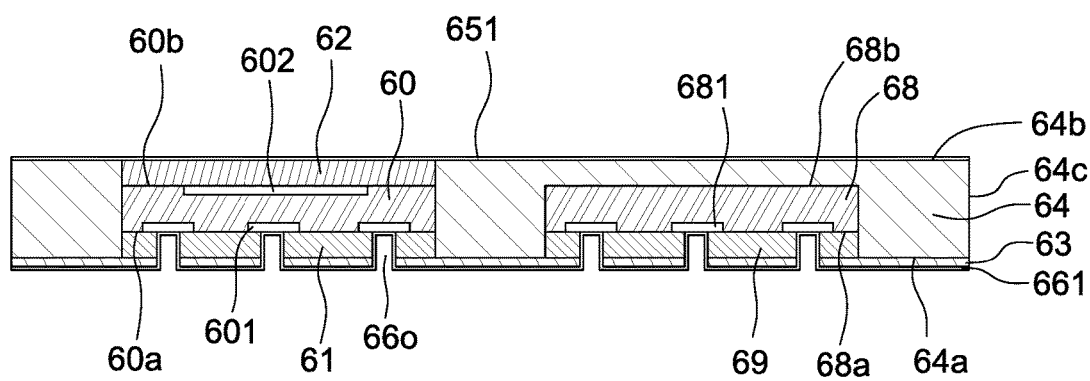

Referring to FIG. 6F, a seed layer 651 and/or seed layer 661 may be formed. The seed layers 651, 661 are conductive and may facilitate subsequent manufacturing processes, such as the formation of conductive layers thereon. As shown in FIG. 6F, the seed layer 661 may be formed on the sidewalls of the adhesive layers 61, 69 and/or the patterned conductive layer 63 and/or formed on the exposed electrodes 601, 681.

Afterwards, a conductive layer may be formed on the seed layer 651 and a patterned conductive layer may be formed on the seed layer 661 to arrive at, for example, a semiconductor package device 5 as shown in FIG. 5. The conductive layer may be formed by any suitable technique, such as electro-plating or electroless-plating (which the seed layer 651 may facilitate) and sputtering. The patterned conductive layer may be formed by suitable techniques, such as electroplating or electroless-plating (which the seed layer 661 may facilitate) and sputtering/filling, followed by suitable patterning techniques, such as photolithography, drilling, laser ablation, and etching (such as, for example, tent etch stripping and/or strip flash etching). In some embodiments, the formation of the conductive layer and any or all parts of the patterned conductive layer (such as vias and traces) may be performed in a single operation.

Figure 7A:
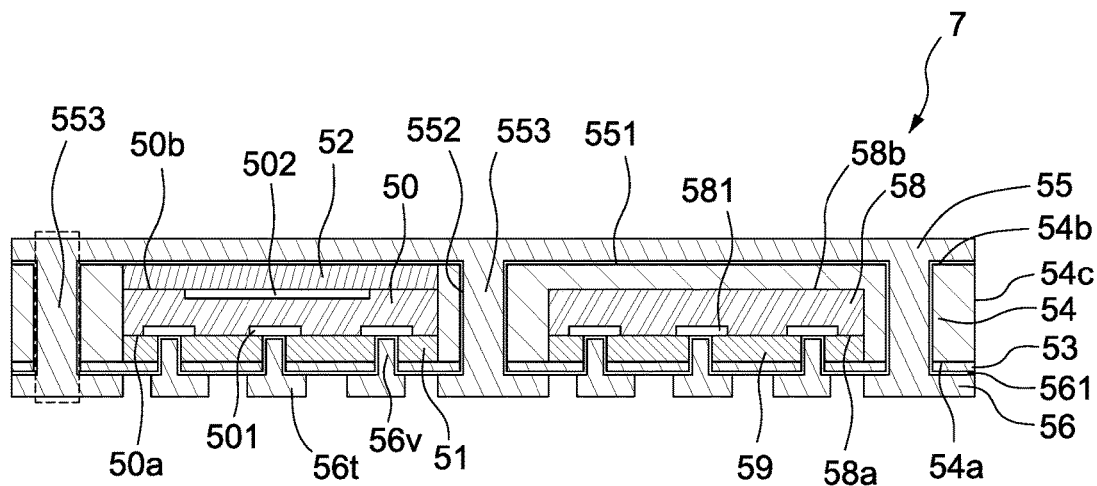
FIG. 7A and FIG. 7B illustrates a cross-sectional view of some embodiments of a semiconductor package device in accordance with a fourth aspect of the present disclosure.

FIG. 7A illustrates a cross-sectional view of a semiconductor package device 7 in accordance with some embodiments of the present disclosure. The semiconductor package device 7 includes a die 50, an adhesive layer 51, a conductive layer 52, a patterned conductive layer 53, an encapsulant layer 54, a conductive layer 55, a patterned conductive layer 56, a die 58, an adhesive layer 59, a seed layer 552 and a conductive interconnect 553.

One difference between the semiconductor package device 5 shown in FIG. 5 and the semiconductor package device 7 shown in FIG. 7A is the conductive interconnect 553, which electrically connects the conductive layer 55 and the patterned conductive layer 56. The number and width of conductive interconnects 553 included in the semiconductor package device 7 may be set to appropriate values to provide, for example, a desired level of electrical and/or thermal communication (such as electrical current and heat dissipation) between, for example, the conductive layer 55 and the patterned conductive layer 56.

In some embodiments, the seed layer 552 and the conductive interconnect 553 include substantially the same materials, in which case a boundary between them may not be readily discernable (e.g. the region in the dashed rectangle in FIG. 7A might be substantially homogenous in composition and/or roughness).

Figure 7B:
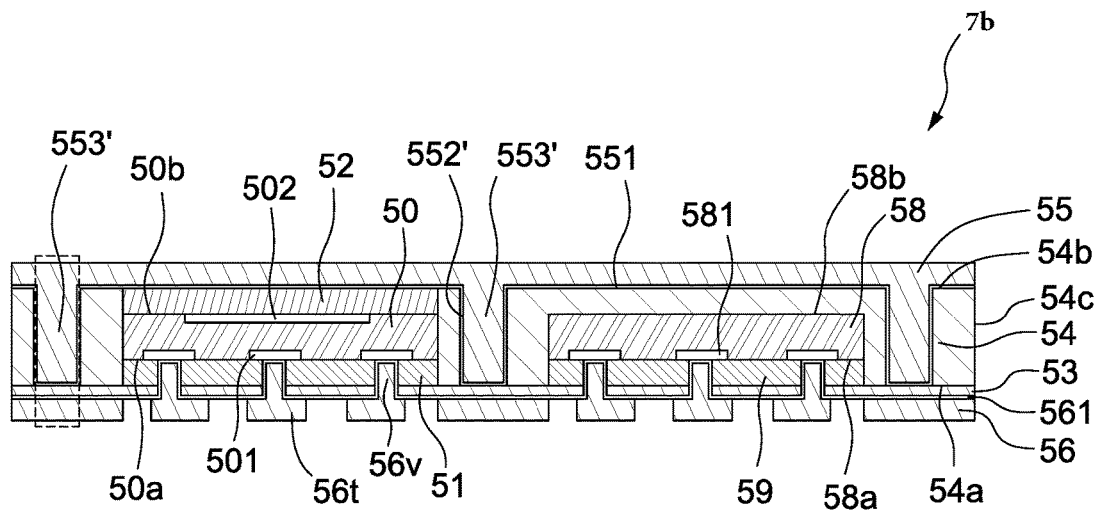

Referring to FIG. 7B, a semiconductor package device 7b is similar to the semiconductor package device 7, but includes interconnection structures 553' rather than the interconnection structures 553, and includes a seed layer 552' rather than the seed layer 552. In some embodiments, the seed layer 552', the conductive interconnect 553', the patterned conductive layer 53, the seed layer 561, the patterned conductive layer 56 all include substantially the same materials, in which case a boundary between them may not be readily discernable (e.g. the region in the dashed rectangle in FIG. 7B might be substantially homogeneous in composition and/or roughness).

FIG. 8A, FIG. 8B, FIG. 8C, FIG. 8D, FIG. 8E and FIG. 8F illustrate a method of manufacturing a semiconductor package device in accordance with some embodiments of the present disclosure.

The processes shown in FIG. 8A, FIG. 8B, FIG. 8C and FIG. 8D are similar to those shown FIG. 6A, FIG. 6B, FIG. 6C and FIG. 6D and thus are not described in detail.

Figure 8A:
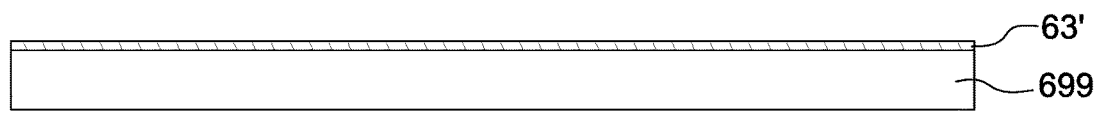
FIG. 8A, FIG. 8B, FIG. 8C, FIG. 8D, FIG. 8E, FIG. 8F and FIG. 8G illustrate a method of manufacturing a semiconductor package device in accordance with some embodiments of the present disclosure.
Figure 8B:
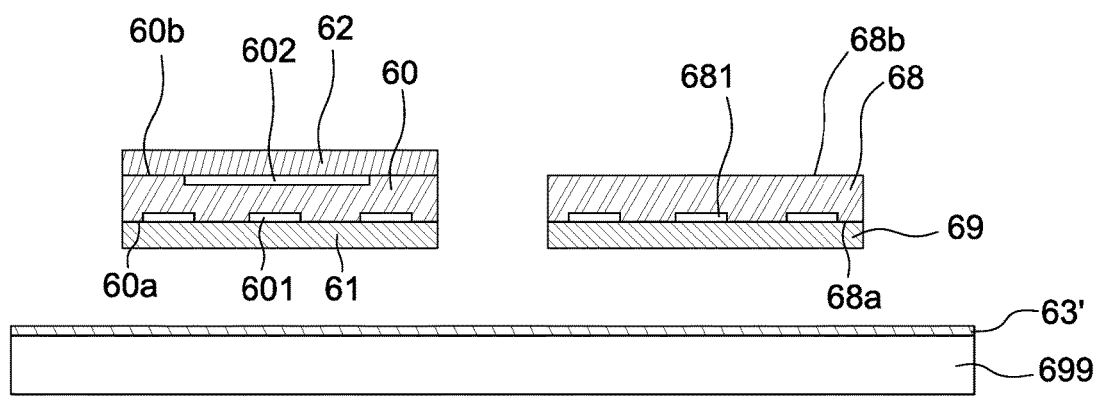
Figure 8C:
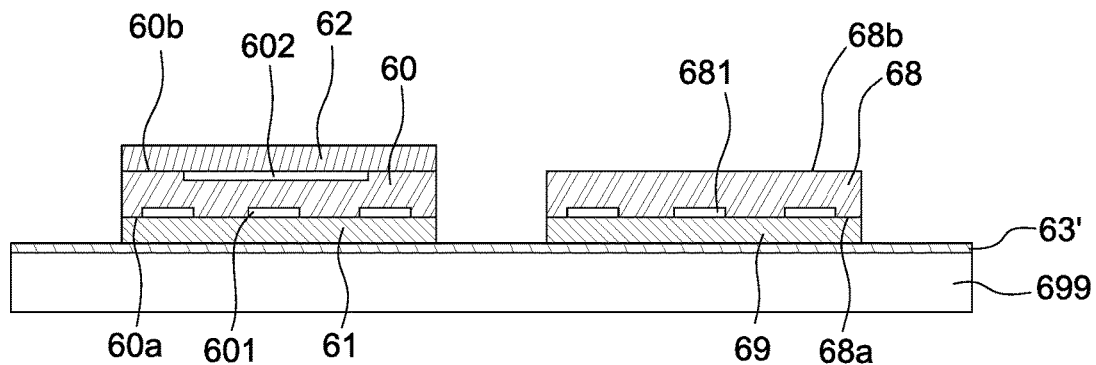
Figure 8D:
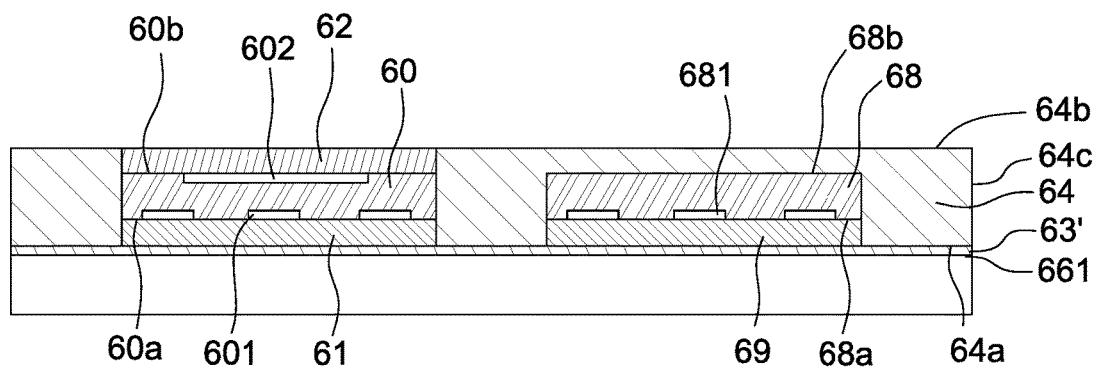
Figure 8E:
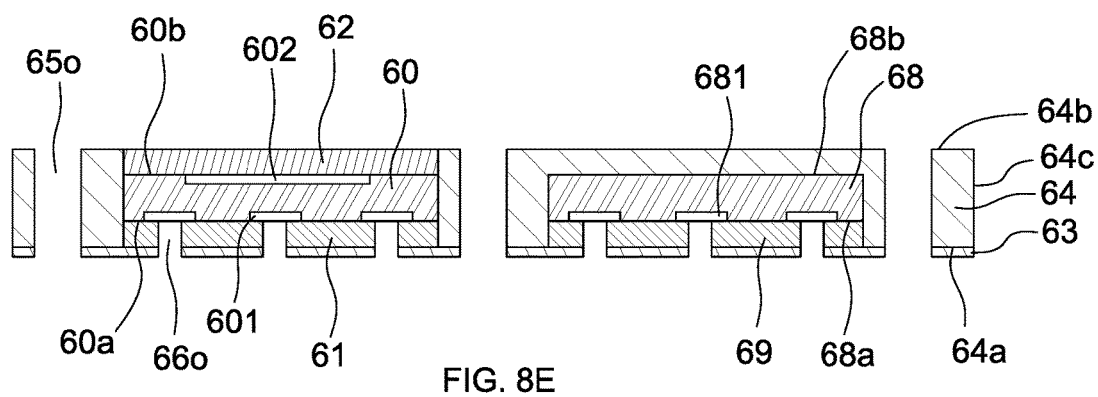

Referring to FIG. 8E, the carrier 699 is removed. At least one opening 65o is formed in the encapsulant layer 64 and the conductive layer 63'. At least two openings 66o that respectively expose the electrodes 601 and 681 are formed in the adhesive layers 61, 69 and the conductive layer 63'. Forming openings in the conductive layer 63' results in a patterned conductive layer, which will herein be referred to as a conductive layer 63. The openings 65o may be formed by removing a portion of the conductive layer 63' and removing a portion of the encapsulant layer 64. The openings 66o may be formed by removing a portion of the conductive layer 63' and then removing a portion of the adhesive layers 61 and 69. The portions may be removed in one, two or more stages. The openings 65o, 66o may be formed by, for example, photolithography techniques, laser ablation, etching and/or drilling. Since the materials of the conductive layer 63', the adhesive layers 61, 69 and the encapsulant layer 64 can differ from each other, it can be advantageous to employ different techniques to remove portions of different layers to form the openings 65o, 66o. After the formation of the openings 65o, 66o, the conductive layer 63' becomes a patterned conductive layer, which is herein referred to as patterned conductive layer 63.

Figure 8F:
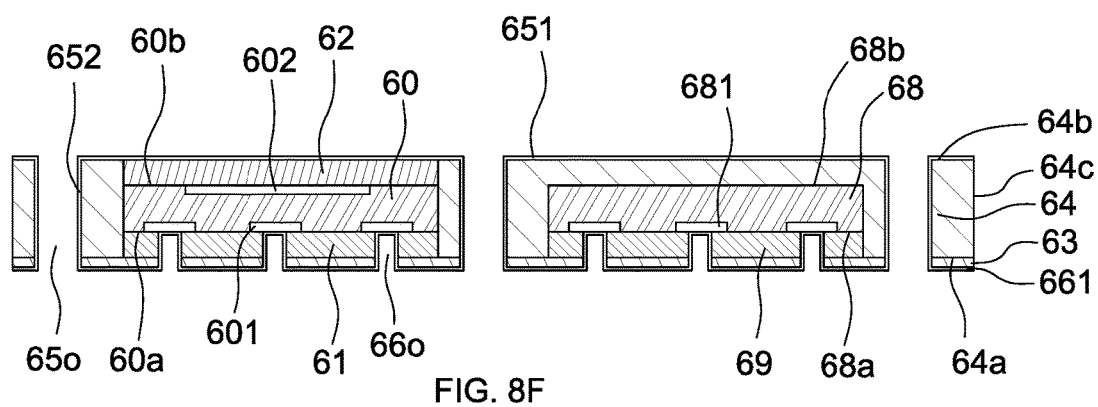

Referring to FIG. 8F, a seed layer 651, a seed layer 652 and/or a seed layer 661 may be formed. The materials included in, and the stages of applying, the seed layers 651, 661 shown in FIG. 8F are similar to those described above in reference to FIG. 6F, and thus are not described in detail. The materials included in, and the stages of applying, the seed layer 652 shown in FIG. 8F are similar to those described above in reference to the seed layer 452 shown in FIG. 4F, and thus are not described in detail.

Afterwards, a conductive layer may be formed on the seed layer 651, a patterned conductive layer may be formed on the seed layer 661, and a conductive interconnect may be formed in the opening 65o to arrive at, for example, a semiconductor package device 7 as shown in FIG. 7A. The conductive layer and conductive interconnect may be formed by any suitable techniques, such as electro-plating or electroless-plating (which the seed layer 651, 652 may facilitate) and sputtering. The patterned conductive layer may be formed by suitable techniques, such as electro-plating or electroless-plating (which the seed layer 661 may facilitate) and sputtering/filling, followed by suitable patterning techniques, such as photolithography, drilling, laser ablation, and etching (such as, for example, tent etch stripping and/or strip flash etching).

Figure 8G:
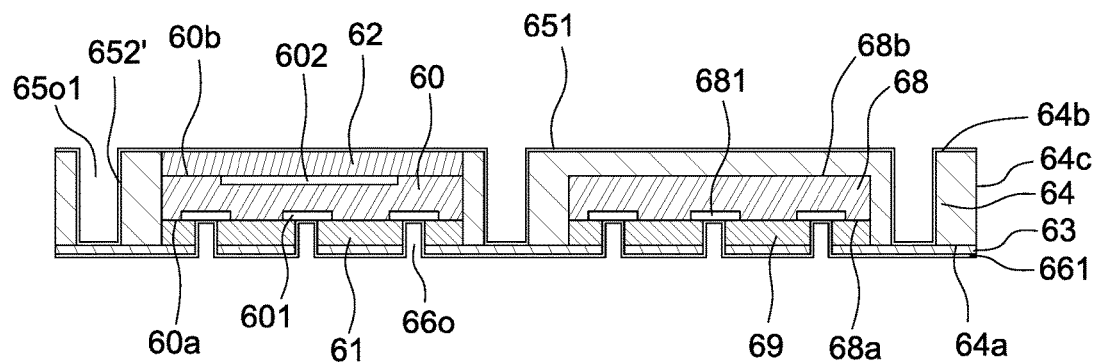

The processes shown in FIG. 8G can be performed, for example, following the processes shown in FIG. 8A, FIG. 8B, FIG. 8C, and FIG. 8D, to manufacture a semiconductor package device in accordance with some embodiments of the present disclosure.

FIG. 8G shows a process similar to that shown in FIG. 8E, but differs in that after the carrier 699 is removed, at least one opening 65o1 is formed in the encapsulant layer 64, and no opening is formed in the conductive layer 63'. At least two openings 66o that respectively expose the electrodes 601 and 681 are formed in the adhesive layers 61, 69 and the conductive layer 63'. Then, a seed layer 651, a seed layer 652' and/or a seed layer 661 may be formed. The materials included in, and the stages of applying, the seed layers 651, 661 in FIG. 8G are similar to those described above in reference to FIG. 8F, and thus are not described in detail. The materials included in, and the stages of applying, the seed layer 652' in FIG. 8G are similar to those described above with respect to the seed layer 652 shown in FIG. 8F, and thus are not described in detail.

Afterwards, a conductive layer may be formed on the seed layer 651, a patterned conductive layer may be formed on the seed layer 661, and a conductive interconnect may be formed in the opening 65o1 to arrive at, for example, a semiconductor package device 7b as shown in FIG. 7B. In some embodiments, the formation of the conductive layer, any or all parts of the patterned conductive layer (such as vias and traces) and the conductive interconnect may be performed in a single operation.

Figure 9:
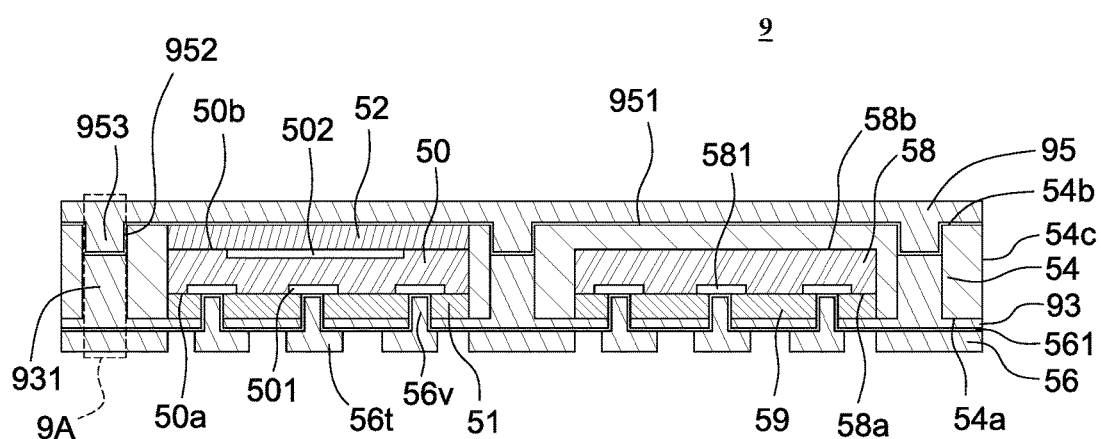
FIG. 9 illustrates a cross-sectional view of some embodiments of a semiconductor package device in accordance with a fifth aspect of the present disclosure.

FIG. 9 illustrates a cross-sectional view of some embodiments of a semiconductor package device 9 in accordance with a fifth aspect of the present disclosure. The semiconductor package device 9 is similar to the semiconductor package device 7 in some respects. Some differences are described below. The semiconductor package device 9 includes a conductive layer 95, a patterned conductive layer 93, a seed layer 951, and a seed layer 952.

The conductive layer 95 includes a protrusion 953. The patterned conductive layer 93 includes a protrusion 931. In some embodiments, the protrusion 931 is a stud. A shape of the seed layer 951 differs from the seed layer 551 so as to accommodate the protrusion 953. In the presently described embodiment, there is no seed layer between the protrusion 931 and the encapsulant layer 54. In some embodiments in which the conductive layer 95, the seed layer 951, the patterned conductive layer 93, the seed layer 561 and the patterned conductive layer 56 include substantially the same materials, a boundary between those parts may not be readily discernable (e.g. the region in the dashed rectangle 9A shown in FIG. 9 might be substantially homogenous in composition and/or roughness).

FIG. 10A, FIG. 10B, FIG. 10C, FIG. 10D, FIG. 10E, FIG. 10F and FIG. 10G illustrate a method of manufacturing a semiconductor package device in accordance with some embodiments of the present disclosure. This method is similar to the method shown in FIG. 6A, FIG. 6B, FIG. 6C, FIG. 6D, FIG. 6E, and FIG. 6F in some respects. Some differences are described below.

Figure 10A:
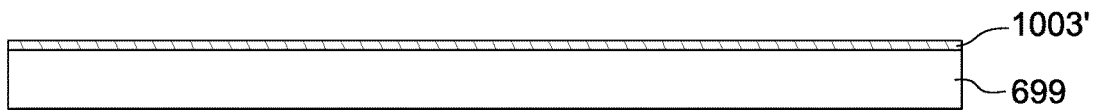
FIG. 10A, FIG. 10B, FIG. 10C, FIG. 10D, FIG. 10E, FIG. 10F and FIG. 10G illustrate a method of manufacturing a semiconductor package device in accordance with some embodiments of the present disclosure.
Figure 10B:
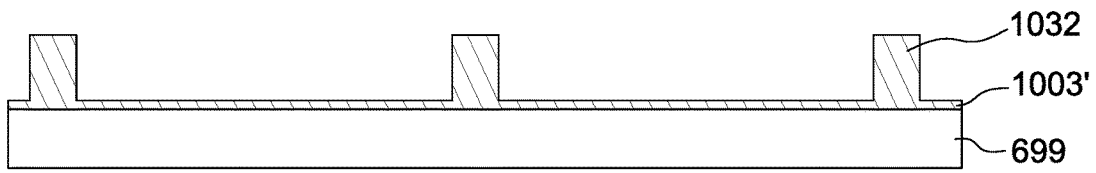

Referring to FIG. 10A, a conductive layer 1003' is provided on the carrier 699. Referring to FIG. 10B, a protrusion (stud) 1032 is formed on the patterned conductive layer 1003'. In some embodiments, the conductive layer 1003' and the protrusion 1032 are integral (e.g. integrally formed) and disposed at the same time on the carrier 699. In some embodiments, the protrusion (stud) 1032 is conductive.

Figure 10C:
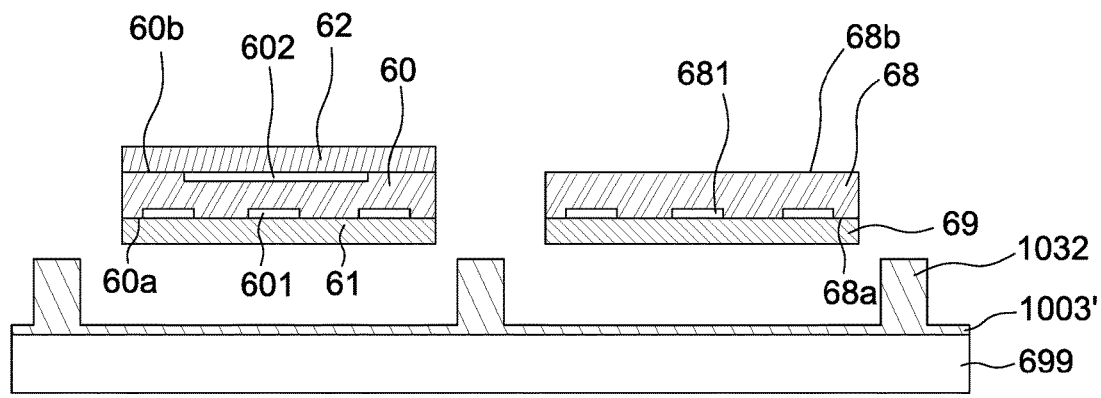
Figure 10D:
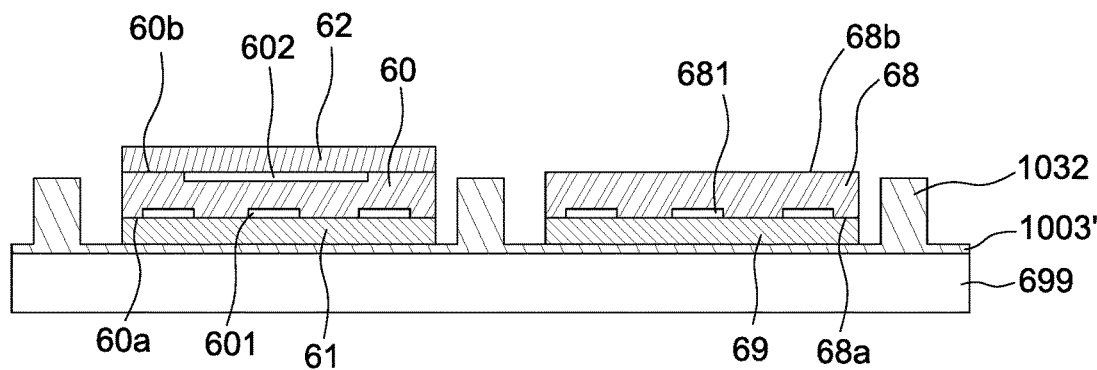

Referring to FIG. 10C and FIG. 10D, a die 60, an adhesive layer 61, an optional conductive layer 62, a die 68 and an adhesive layer 69 are provided on the conductive layer 1003'. In some embodiments, the protrusion (stud) 1032 can help to determine the locations of the dies 60, 68 during a manufacturing process and to improve registration thereof.

Figure 10E:
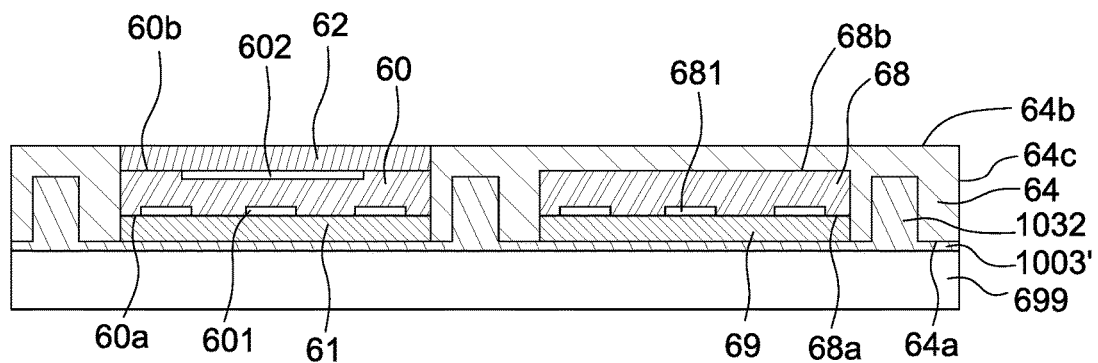

Referring to FIG. 10E, the encapsulant layer 64 is formed and encapsulates the protrusion 1032.

Figure 10F:
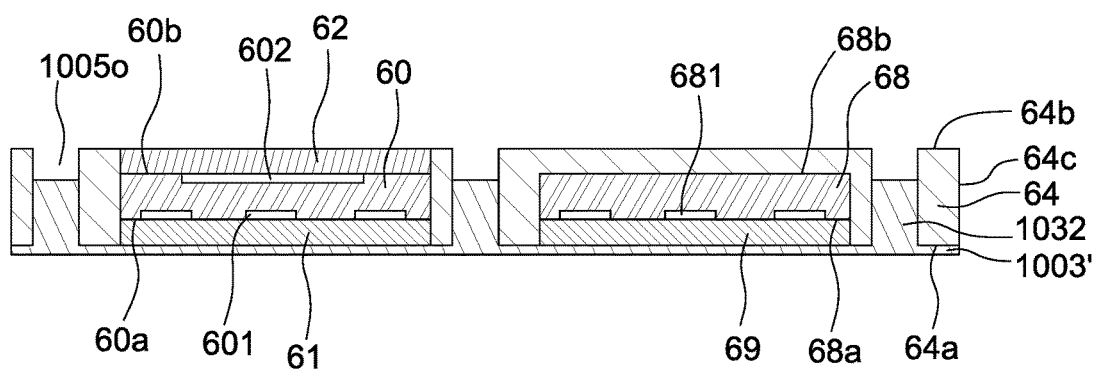

Referring to FIG. 10F, an opening 1005o is formed in the encapsulant layer 64 to expose the protrusion 1032. In embodiments that include more than one protrusion 1032, a total number of openings 1005o that are formed may correspond to a total number of the protrusions 1032.

Figure 10G:
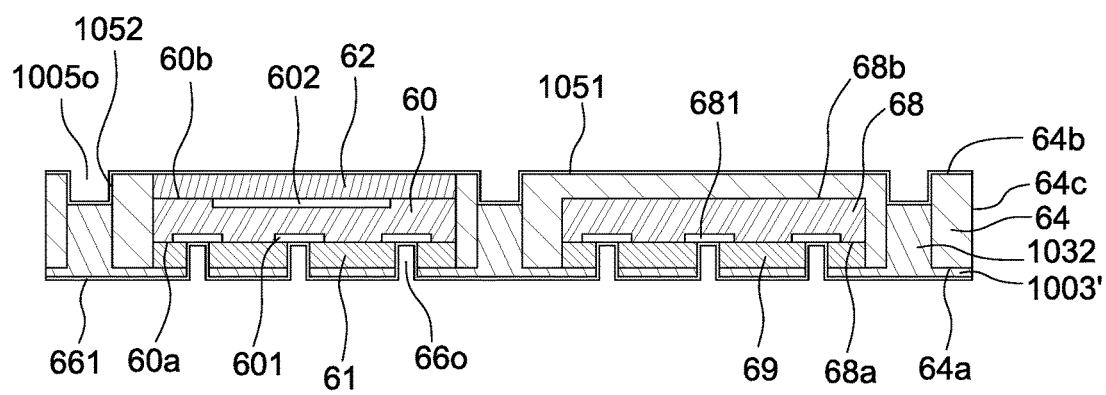

Referring to FIG. 10G, seed layers 1051, 1052 are formed on the encapsulant layer 64. The seed layer 1052 is formed in the opening 1005o. At least one opening 66o is formed in the conductive layer 1003' and in the adhesive layer 61 to expose at least one electrode of the die 60. The conductive layer 1003' becomes patterned after the opening 66o is formed, and is herein referred to as the patterned conductive layer 1003. A seed layer 661 may optionally be formed on the patterned conductive layer 1003.

Afterwards, a conductive layer with a protrusion may be formed on the seed layer 1051, and a patterned conductive layer may be formed on the seed layer 661 to arrive at, for example, a semiconductor package device 9 as shown in FIG. 9. The conductive layer with a protrusion may be formed by any suitable technique, such as electro-plating or electroless-plating (which the seed layer 1051, 1052 may facilitate) and sputtering. The patterned conductive layer may be formed by suitable techniques, such as electro-plating or electroless-plating (which the seed layer 661 may facilitate) and sputtering/filling, followed by suitable patterning techniques, such as photolithography, drilling, laser ablation, and etching (such as, for example, tent etch stripping and/or strip flash etching). In some embodiments, the formation of the conductive layer and any or all parts of the patterned conductive layer (such as vias and traces) may be performed in a single operation.

Although the protrusion or stud is illustrated in a method of manufacturing a semiconductor package device with more than one die, the protrusion or stud may also be adapted to form a semiconductor package device with a single die.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (for example, in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a die having a first surface and a second surface opposite to the first surface, the die comprising a first electrode disposed at the first surface of the die and a second electrode disposed at the second surface of the die;

an adhesive layer disposed on the first surface of the die; and an encapsulant layer encapsulating the die and the adhesive layer, wherein substantially an entire surface of the second electrode is exposed from the encapsulant layer.

2. The semiconductor package device of claim 1, further comprising a first conductive layer disposed on the encapsulant layer, wherein the first conductive layer is in thermal and electrical communication with the second electrode and covers substantially the entire surface of the second electrode.

3. The semiconductor package device of claim 2, wherein a lateral surface of the encapsulant layer is substantially coplanar with a side surface of the first conductive layer.

4. The semiconductor package device of claim 2, further comprising a conductive via disposed in the encapsulant layer electrically connected to the first conductive layer.

5. The semiconductor package device of claim 4, further comprising:

a patterned conductive layer disposed on the encapsulant layer and electrically connected to the conductive via.

6. The semiconductor package device of claim 5, further comprising a seed layer disposed between the conductive via and the encapsulant layer.

7. The semiconductor package device of claim 1, further comprising a conductive via disposed in the adhesive layer, wherein at least a portion of a surface of the first electrode is exposed from the adhesive layer and electrically connected to the conductive via.

8. The semiconductor package device of claim 7, further comprising:

a seed layer disposed between the first electrode and the conductive via and between the conductive via and the adhesive layer.

9. The semiconductor package device of claim 1, further comprising a first conductive layer disposed on the second surface of the die.

10. The semiconductor package device of claim 1, further comprising:

a conductive via disposed in the adhesive layer and electrically connected to the die; and a patterned conductive layer disposed on the encapsulant layer and electrically connected to the conductive via.

11. The semiconductor package device of claim 2, further comprising a second conductive layer disposed between the first conductive layer and the second electrode.

12. The semiconductor package device of claim 11, further comprising a seed layer disposed between the first conductive layer and the second conductive layer.

13. The semiconductor package device of claim 11, wherein the second conductive layer is in direct contact with the second electrode and covers the second electrode.

14. A method of manufacturing a semiconductor package device, the method comprising:

providing a carrier having a first conductive layer disposed thereon;

attaching a first side of a die to the carrier through an adhesive layer, the die comprising a first electrode disposed at the first side and a second electrode disposed at a second side opposite to the first side;

encapsulating the die and the adhesive layer with an encapsulant such that substantially an entire surface of the second electrode of the die is exposed from the encapsulant; and removing the carrier.

15. The method of claim 14, further comprising removing a portion of the first conductive layer and a portion of the adhesive layer to form an opening that exposes the first electrode.

16. The method of claim 15, further comprising filling the opening with a conductive material to form a first conductive via.

17. The method of claim 14, further comprising forming a second conductive layer on the encapsulant and electrically connecting the second conductive layer to the second electrode.

18. The method of claim 17, further comprising:

removing a portion of the first conductive layer and a portion of the adhesive layer to form an opening that exposes the first electrode; and filling the opening with a conductive material to form a first conductive via, wherein the formation of the first conductive layer and the first conductive via is performed in a single operation.

19. The method of claim 17, further comprising:

removing a portion of the first conductive layer and a portion of the adhesive layer to form an opening that exposes the first electrode;

filling the first opening with a conductive material to form a first conductive via; and forming a second conductive via in the encapsulant.

20. The method of claim 14, further comprising:

forming a conductive stud adjacent to an area where the die is to be placed on the carrier;

encapsulating the conductive stud when encapsulating the die and the adhesive layer; and exposing the conductive stud.

* * * * *